United States Patent [19]

Phillips et al.

[11] Patent Number: 4,922,250

[45] Date of Patent: * May 1, 1990

[54] SUPERCONDUCTING ANALOG-TO-DIGITAL CONVERTER WITH BIDIRECTIONAL COUNTER

[75] Inventors: Richard R. Phillips, Gardena; Robert D. Sandell, Manhattan Beach; Arnold H. Silver, Rancho Palos Verdes, all of Calif.

[73] Assignee: TRW Inc., Redondo Beach, Calif.

[*] Notice: The portion of the term of this patent subsequent to Feb. 24, 2004 has been disclaimed.

[21] Appl. No.: 16,997

[22] Filed: Feb. 19, 1987

Related U.S. Application Data

[63] Continuation of Ser. No. 648,868, Sep. 7, 1984, Pat. No. 4,646,060.

[51] Int. Cl.$^5$ .............................................. H03M 1/12
[52] U.S. Cl. .................................... 341/133; 341/164; 341/171
[58] Field of Search ................ 340/347 AD; 377/123; 341/133, 134, 157, 164, 171

[56] References Cited

U.S. PATENT DOCUMENTS

| | | | |
|---|---|---|---|
| 3,263,097 | 7/1966 | Noble | 377/123 |
| 3,983,419 | 9/1976 | Fang | 341/171 |
| 4,315,255 | 2/1982 | Harris et al. | 341/133 |
| 4,551,704 | 11/1985 | Anderson | 341/133 |
| 4,672,359 | 6/1987 | Silver | 341/133 |

OTHER PUBLICATIONS

Hamilton "100 GHz Binary Counter Using Squid Flip Flops" IEEE Transactions on Magnetics, vol. MAG-19, No. 3, May 1983, pp. 1291–1292.

Hamilton "Analog Measurement Applications for High Speed Josephson Switches" IEEE Trans. on Magnetics, vol. MAG-17, No. 1, Jan. 1981, pp. 577–582.

Herrell "IBM Technical Disclosure Bulletin" vol. 17, No. 10, Mar. 1975, pp. 3049–3050.

Primary Examiner—William M. Shoop, Jr.
Assistant Examiner—Gary Romano
Attorney, Agent, or Firm—Noel F. Heal; Sol L. Goldstein

[57] ABSTRACT

An analog-to-digital converter quantizer and bidirectional counter using superconducting quantum interference devices (SQUD's) as the principal elements. A double-junction non-latching SQUID is used as a quantizer to produce unipolar output pulses on two different output lines, indicative of positive and negative increments of change in an analog signal current. The unipolar pulses are then counted in a bidirectional counter that employs double-junction non-latching SQUID's as counter stages and as logic gates for the propagation of carry and borrow signals from stage to stage.

13 Claims, 2 Drawing Sheets

SUPERCONDUCTING ANALOG-TO-DIGITAL CONVERTER WITH BIDIRECTIONAL COUNTER

This invention was made with Government support under N00014-82-C-03977 awarded by the Department of the Navy. The Government has certain rights in this invention.

This application is a continuation, of application Ser. No. 648,868, filed 9/7/84 now U.S. Pat. No. 4,646,060.

BACKGROUND OF THE INVENTION

This invention relates generally to high-performance analog-to-digital (A/D) converters, and more particularly, to techniques for A/D conversion employing superconducting Josephson junction devices. There is a requirement for high-performance A/D conversion equipment in both military and commercial applications. Two important measures of A/D converter performance are speed, i.e., the sampling rate in samples converted per second, and resolution, as measured by the smallest increment of change that can be detected in an analog signal. Many applications require both high sampling rates and high resolutions. Conventional techniques employing semiconductor circuitry have not been able to satisfy this requirement.

A/D conversion using Josephson junctions has been described in the technical literature. John P. Hurrell et al. described one such technique in a paper entitled "Analog-to-Digital Conversion with Unlatched SQUID's," published in the IEEE Transactions on Electron Devices, Vol. ED-27, No. 10, pp. 1887-96 (October 1980). SQUID is an acronym for Superconducting Quantum Interference Device.

The theory of operation of SQUID's for use in A/D conversion is explained in detail in the Hurrell et al. paper, and only a simplified explanation will be provided here. Similarly, the theory of operation of Josephson junctions is now widely known, and has been the subject of discussion in many technical papers. For example, see B. D. Josephson, "Supercurrents through Barriers," Advan. Phys., Vol. 14, pp. 419-51 (1965), and other papers cited in the Hurrell et al. paper.

A Josephson junction has a current-voltage characteristic that includes a region in which the current increases rapidly from zero, with practically no corresponding increase in voltage across the device. A SQUID is a circuit including one or more Josephson junctions and one or more inductive loads. A single-junction SQUID includes a Josephson junction connected across an inductance. If a current is injected into one end of the inductance and the other end is grounded, the resulting characteristics provide the basis for A/D conversion, as explained in detail in the Hurrell et al. paper.

The most pertinent property of the single-junction SQUID, from the standpoint of A/D conversion, is to be found in the relationship between the magnetic flux in the SQUID and the value of the injected current. This flux-current relationship is a periodic and, depending on the circuit parameters chosen, a multi-valued function. The most significant aspect of the relationship is that the flux changes by a small quantum whenever the current increases by a small and precisely repeatable increment. This quantum of flux gives rise to a small but measurable voltage pulse across the junction. When the current is decreased, a flux quantum of opposite polarity is produced for each precise decrement of current, and a corresponding voltage pulse of opposite polarity is produced across the junction.

This property of the single-junction SQUID forms the basis for the A/D converter described in the Hurrell et al. paper. A signal to be converted from analog to digital form is introduced into the single-junction SQUID as a varying current. Each time the current increases or decreases by a predetermined increment, a measurable voltage pulse is generated across the junction. In this manner the single-junction SQUID functions as a quantizer. The resultant pulses are then detected and counted in one or more counters. The principal advantage of the arrangement is its near perfect linearity. Another advantage is its sensitivity. The current increment, which determines the resolution" can be made extremely small. The flux quantum is only $2.07 \times 10^{-15}$ weber, and the current increment is given by this value divided by the value of the load inductance (measured in henries).

A simple, two-stage counter for detection and recording of the pulses from the single-junction SQUID quantizer is also described in the Hurrell et al. paper. The counter described is a unidirectional two-stage one, employing double-junction SQUIDS as the counting elements. A double-junction SQUID comprises two Josephson junctions and a inductance. The end terminals of the inductance are connected to a terminal of each of the junctions, and the other terminals of the junctions are connected together to ground. A control current is injected across the inductance, and a gate current is injected at the center tap of the inductance.

As explained in detail in the Hurrell paper, the double-junction SQUID circuit is bi-stable if the currents are appropriately chosen and controlled. Basically, in each of its two stable states the circuit has a circulating current component that flows through both of the junctions and the inductance. The direction of the circulating current component determines which state the circuit is in. When the gate current is raised momentarily above a threshold level, one of the junctions generates a voltage pulse and the direction of the circulating current reverses. Subsequent pulses applied to the gate current toggle or reverse the state of the SQUID. Multiple circuits working on this principle can be connected in a cascade arrangement to operate as a binary scaler, counting the number of pulses from the quantizer.

Although the underlying theory of the SQUID A/D converter has been previously described by Hurrell et al., their device was not an ideal one in some respects. First, the Hurrell et al. quantizer employs a single-junction SQUID that produces pulses of two different polarites, depending on the direction of movement of the signal to be converted. Secondly, the associated counter disclosed is only a unidirectional binary scaler, capable of counting pulses of one type, corresponding, for example, to increases in current, but not decreases. To be of practical use, the converter would have to include another counter capable of detecting pulses of opposite polarity, for registering the decreasing steps of current. The values in the two counters would then need to be subtracted as each sample digital value was generated. Clearly, it would be desirable to avoid this additional complexity, and provide an A/D converter capable of producing a single digital output sample from a bidirectionally varying input signal. The present invention is directed to this end.

SUMMARY OF THE INVENTION

The present invention resides in a bidirectional signal quantizer of the superconducting SQUID type, producing a unipolar pulse output. In accordance with another aspect of the invention, a bidirectional single-flux-quantum ripple counter is provided. Although the counter complements the quantizer and provides a complete A/D converter structure, the counter may also be used in applications other than A/D conversion.

Basically, the quantizer of the invention comprises a double-junction SQUID device connected to provide pulses of the same polarity on two different output lines, indicative of increases and decreases in an input signal current. The double-junction SQUID structure has been previously disclosed in the technical literature, but not as a single-flux-quantum quantizer with a unipolar pulse output. Double-junction SQUID's have been proposed for use in a number of other applications, including that of a bistable circuit in a counter or scaler. In the latter context, a fixed control current is injected at one end of an inductor load in the circuit, and a gate current is pulsed to toggle the circuit from one state to the other. In the context of the present invention, however, the double-junction SQUID is employed as a quantizer with a unipolar pulse output.

Basically, and in general terms, the A/D converter of the invention includes an inductance having a center-tap terminal and two end terminals, and first and second Josephson junctions, each having first and second terminals, the first terminals being connected together and the second terminals being connected to opposite end terminals of the inductance. The converter also includes means for applying a constant gate current to the center-tap terminal of the inductance, and means for applying a bidirectionally varying analog signal current to the inductance. Positive incremental changes in the analog signal current result in the generation of voltage pulses across the first junction, and negative incremental changes in the analog signal current result in the generation of voltage pulses of the same polarity across the second junction. The converter further includes means for counting algebraically the voltage pulses generated across the first and second junctions, to determine the corresponding digital value of the changes in the analog signal current.

The bidirectional counter of the invention includes a plurality of double-junction superconducting quantum interference devices (SQUID's) connected together to receive up-count pulses and down-count pulses as input signals, the up-count pulses being of the same polarity as the down-count pulses. Each scaler or counter SQUID is configured as a bistable circuit, and includes a single input terminal for input of a toggling input pulse, and two output terminals, for output of a carry signal or a borrow signal, depending on the binary state of the SQUID. The counter further includes means for clocking an up-count signal to the input terminal of a first-stage SQUID, and means for clocking a down-count signal to the same input terminal, to toggle the state of the first-stage SQUID upon the occurrence of an up-count signal or a down- count signal. The counter also includes means responsive to an up-count signal for enabling propagation of a carry signal to the input terminal of a subsequent stage, and means responsive to a down-count signal for enabling propagation of a borrow signal to the input terminal of the subsequent stage. An up-count signal will ripple from stage to stage as a carry signal, changing the binary state of each stage, and generating a further carry signal if the initial state of the stage was a "1." A down-count signal will also ripple from stage to stage, but as a borrow signal, changing the state of each stage and generating a further borrow signal if the initial state of the stage was a "0."

In the illustrative embodiment of the invention, the means for enabling propagation of the carry and borrow signals include a plurality of AND gates implemented as double-junction SQUID's. Each AND gate in the means for enabling carry signal propagation has as one input the carry signal from a current stage, and has as its other input an enabling signal derived from the up-count signal. Likewise, each AND gate in the means for propagating the borrow signal has as one input the borrow signal from a current stage, and has as its other input a signal derived from the down-count signal.

The counter of the invention also includes sensing means, for determining the contents of the counter. The sensing means preferably includes a voltage latching double-junction SQUID at each stage of the counter. A sensing signal is coupled into each successive stage of the counter, and a pulse is generated at the carry-signal output of the stage only if the binary state of the stage was a "1." The carry signal output is coupled as an input-signal to the sensing SQUID, which is clocked to provide a voltage level output indicative of the state of the input signal.

It will be appreciated from the foregoing that the present invention represents a significant advance in the field of high-performance A/D converters and bidirectional counters. In particular, the invention provides a superconducting quantizer capable of quantizing a bidirectionally varying analog input signal and producing unipolar output pulses at a pair of output terminals, indicative of increases and decreases in the analog input signal. In addition, the invention provides a bidirectional counter capable of handling unipolar up-count and down-count signals and producing an accumulated binary count indicative of the cumulative up-count and down-count signals. Other aspects and advantages of the invention will become apparent from the following more detailed description, taken in conjunction with the accompanying drawings.

BRIEF DESCRIPTION OF THE DRAWINGS

FIG. 4b is a graph showing the relationship between gate current and injection current in the circuit of FIG. 4a.

DESCRIPTION OF THE PREFERRED EMBODIMENT

Figure 1A:
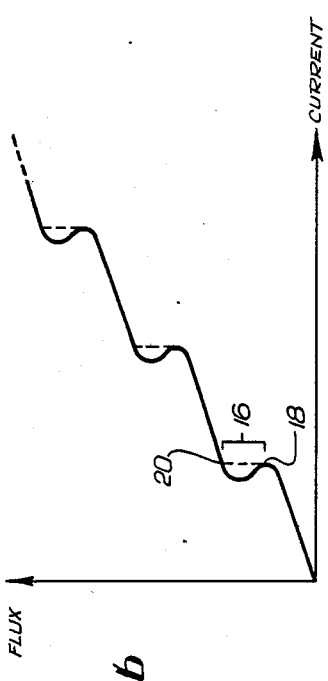
FIG. 1a is a schematic diagram of a single-junction SQUID.

As shown in the drawings for purposes of illustration, the present invention is concerned with superconducting analog-to-digital (A/D) converters. The principles of A/D conversion using superconducting quantum interference devices (SQUID's) has been described in the technical literature, as in the previously cited paper by Hurrell et al.

Figure 1B:
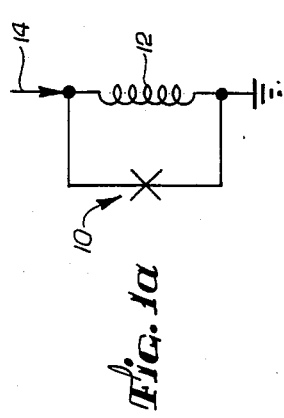
FIG. 1b a graph showing the flux-versus-current relationship for a single-junction SQUID.

FIG. 1a shows a simple single-junction SQUID circuit, comprising a Josephson junction device, indicated by reference numeral 10, connected across a load inductance 12. One terminal of the load inductance is grounded and the other terminal is connected to a current source, indicated at 14. FIG. 1b is a simplified representation of the relationship between the injected current and the magnetic flux linking the inductance 12. It will be seen that, as the current increases, the flux also increases, until a multi-valued region of the curve is reached, as indicated at 16. When a current-reversal point 18 is reached, further increase in the current causes the flux to jump to a higher level on the curve, as indicated at 20. This sudden flux increment results in a small but measurable voltage pulse across the junction 10. The curve of FIG. 1b is perfectly periodic. In other words, the current increments between successive peaks in the curve are uniform, as are the flux increments that are generated as a result of the current increments. This, then is the basis of the A/D converter using superconducting devices. When the current through the circuit falls, increments of flux in the opposite sense are generated, and corresponding voltage pulses are generated across the junction 10.

Although a single-junction SQUID may be used in this manner as an A/D converter, it produces pulses of different polarities to indicate increases and decreases in analog current. Consequently, separate means must be provided for detecting and counting the two types of pulses, and for subtracting the two resulting accumulated counts.

In accordance with the present invention, a superconducting A/D converter has a quantizer that yields up-count pulses and down-count pulses of the same polarity, but on two different output terminals, indicative of increases and decreases in an analog input signal. A bidirectional counter associated with the quantizer accumulates the combined effect of both the up-count pulses and the down-count pulses.

Figure 2:
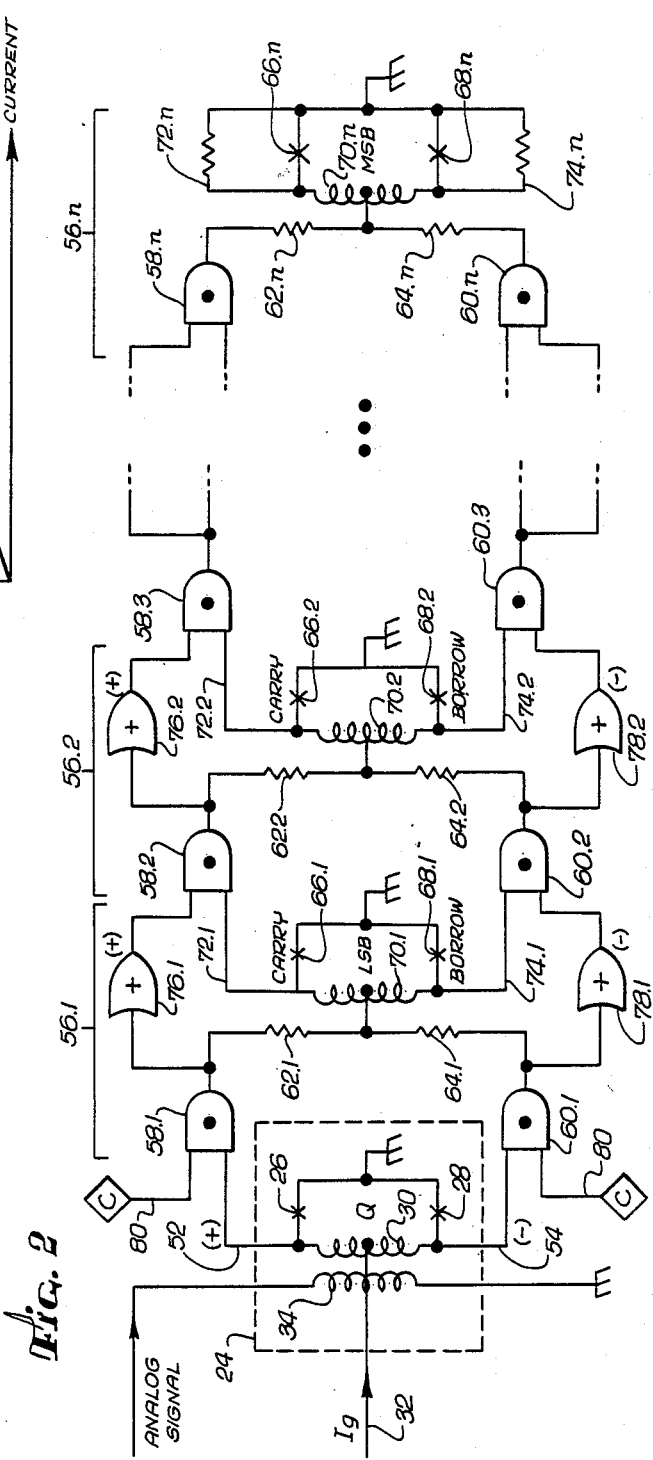
FIG. 2 is a simplified schematic diagram of a bidirectional analog-to-digital converter in accordance with the invention.

FIG. 2 shows the A/D converter of the invention, including a double-junction non-latching SQUID quantizer 24 and a bidirectional counter (the remainder of the figure). The quantizer 24 includes two Josephson junctions 26 and 28 and a center-tapped load inductance 30. One terminal of each of the junctions 26 and 28 is connected to ground, and the other terminal of each junction is connected to a different end terminal of the inductance 30. A gate current is injected into the center-tap terminal of the inductance, as indicated at 32, and an analog input signal is transformer-coupled to the inductance 30 by means of a winding 34 through which the signal is passed. The analog signal may alternatively be direct-coupled to the inductance, but is, in any event, injected as a varying analog current in the circuit comprising the inductance 30 and the junctions 26 and 28.

The quantizer 24 operates to provide a voltage output pulse across one of the junctions 26, 28 in the event of an increase in analog signal, and a voltage output pulse across the other of the junctions in the event of a decrease in the analog signal. This effect is obtained as a result of some relatively complex relationships among the circuit elements, but an intuitive explanation of the effect can be given, using a so-called pendulum analogy. This analogy is used in the cited Hurrell paper to explain operation of the double-junction SQUID in the context of a bistable device. In the case of the quantizer, however, the double-junction SQUID is not being used as a bistable device.

Figure 3:
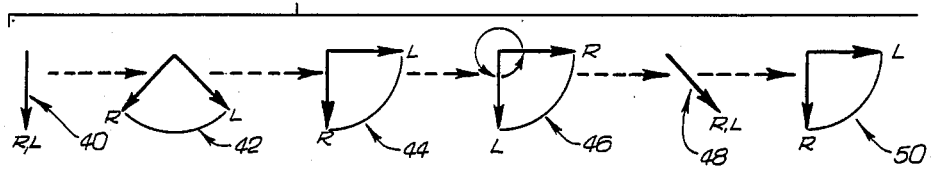
FIG. 3 is a diagram showing successive phase relationships between the junctions in a dual-junction SQUID.

The quantity e is the quantum phase angle across a Josephson junction, and is related to the magnetic flux $\theta$ by the relationship $\theta/\theta_0 = \theta 2\pi$, where $\theta_0$ is a single-flux quantum of flux. In the graph of FIG. 1b, the phase angle increases by $2\pi$ for each flux increase of a single quantum. A similar relationship exists in the double-junction SQUID, and the phase-angle or pendulum analogy shown in FIG. 3 shows successive phase-angle relationships as the analog signal current is gradually increased. The letters R and L denote the "left" and "right" junctions, and are arbitrary designations for the two junctions 26 and 28.

Initially, if one assumes zero gate current and zero analog signal current, there is no flux through the inductance 30 and both phase angles are at the zero position, indicated by a single downwardly directed line 40. If the analog current were increased without any gate current, a circulating current, and corresponding circulating flux, would be set up in the loop that includes the two junctions 26 and 28. As indicated at 42, the phase angles would become mutually displaced, one positively and one negatively. If the analog current signal were increased further from this condition, a quantum increase in flux would occur, but the status of the junctions would be, in a sense, indeterminate. A voltage pulse would be generated at one or the other of the junctions, and operation of the circuit could not be reliably controlled.

If an appropriate gate current is then applied through the center tap of the inductance 30, the phase angles of the two junctions are together displaced positively, as shown at 44. The relative displacement of the two angles remains constant, but the phase angle of the junction designated R is reduced to practically zero. This has the effect of biasing or polarizing the circuit in such a way that a subsequent quantum change of flux will affect a selected one of the junctions, but not the other one. Now if the analog current is increased further, to provide a quantum increase in flux, the phase angle $\theta_L$ will suddenly make a transition of practically 270 degrees, while the transition for phase angle $\theta_R$ is only about 90 degrees, as indicated at 46. The junction designated L generates a transient voltage pulse across it as a result of the quantum change in phase angle and flux. Subsequent increases in the analog current will move the phase angles $\theta_L$ and $\theta_R$ in the same directions as they were moved by the increase illustrated at 42, i.e. $\theta_L$ will increase (move counter-clockwise) and $\theta_R$ will decrease. This will move the phase angles through a zero mutual displacement position, shown at 48, and then to the position shown at 50, which is the same as the position shown at 44. Further increases in the analog current will therefore result in the generation of further voltage pulses across the same junction. By similar reasoning, decreases in the analog signal current result in the generation of voltage pulses across the other one of the junctions 26 and 28.

The quantizer 24 produces voltage pulses on line 52, from the ungrounded terminal of junction 26, in response to incremental increases in analog signal current, and produces pulses of the same polarity on line 54 from the ungrounded terminal of the other junction 28, in response to incremental decreases in the analog signal current. As will be explained in more detail, these pulses are coupled to a bidirectional counter having multiple stages, the first two being indicated at 56.1 and 56.2, and the last, or most significant stage being indicated at 56.n. Each counter stage 56 has a pair of input AND gates 58 and 60, the outputs of which are coupled through resistors 62 and 64 to a common input to the stage. Each stage includes a non-latching double-junction SQUID having two Josephson junctions 66 and 68 and a center-tapped inductance 70. Each of these SQUID's is connected in the same manner as the quantizer SQUID 24. The input is the center tap of the inductance 70 and is connected to the junctions between the two resistors 62 and 64. A "carry" output is provided on line 72 from one end of the inductance 70 and a "borrow" output is provided from the other end of the inductance, on line 74. Each stage 56 also has an associated pair of OR gates 76 and 78, the purpose of which will be explained shortly. For simplicity of illustration in FIG. 2, no circuitry is shown for applying a bias gate current to the center tap of each inductance 70 and a control current through each inductance.

Lines 52 and 54 from the quantizer 24 are coupled as inputs to the AND gates 58.1 and 60.1 of the first counter stage 56.1. The other input to each AND gate 58.1 and 60.1 is a clocking signal, indicated at 80. In subsequent stages of the counter, outputs on lines 72 and 74 are coupled as inputs to the respective AND gates 58 and 60 of the next successive stage. The outputs from the last stage 56.n, on lines 72.n and 74.n, are resistively terminated to ground, as shown. The outputs of the AND gates 58 and 60 for each stage are coupled to the input of that stage, and also as the sole input of the respective OR gates 76 and 78. The outputs of the OR gates 76 and 78 are connected to the second input terminals of AND gates 58 and 60 in the next subsequent stage.

Before proceeding with an explanation of the manner in which the counter operates, it will be helpful to review some basic concepts of binary addition and subtraction. Upward counting using a ripple counter is performed by adding a binary "1" in the least-significant bit position, and allowing any generated carry bit to propagate or ripple to stages of higher significance. The rules of counting in this manner are to change the first (least significant) bit, from 1 to 0 or 0 to 1; then to change the binary state of each succeeding stage until a change from 0 to 1 is made, at which point the operation is terminated. Some examples are:

10101+1=10110

11100+1=11101

00111+1=01000

The rules of decrementing or counting down by one are almost identical. The state of the first or least significant bit is changed, then the state of each succeeding bit until a 1 is changed to a 0, at which point the operation is terminated. Some examples are:

10110−1=10101

11101−1=11100

01000−1=00111

The bidirectional counter of FIG. 2 is arranged to perform these operations automatically as a result of the up-count and down-count pulses received from the quantizer 24 over lines 52 and 54. As will be explained in more detail, each of the stages 56 functions in a manner analogous to a flip-flop that can be toggled between two binary states. Each time that an input pulse is applied, along with a clock or enabling signal, to one of the stages 56, an output pulse is produced on one of the lines 72 and 74, in alternating sequence. That is, if a first input pulse produces an output on line 72, a second pulse will produce an output on line 74, and so forth. Consider that the "1" state of a counter stage 56 is the one that exists when the next input pulse would produce a "carry" output on line 72. The "0" state of the stage exists when the next input pulse would produce "borrow" output on line 74.

Now consider the sequence of events that ensues when an "up-count" signal appears on output line 52 from the quantizer 24. The "up-count" signal will be applied as an input to the first stage 56.1. If the first stage is in a "1" state, a carry signal will be generated on ouput line 72.1, to be propagated to the second stage 56.2. Moreover, the original upcount signal from the AND gate 58.1 is propagated to the second stage 56.2 through OR gate 76.1, the output of which enables the second-stage AND gate 58.2 at an appropriate time to gate the carry signal on line 72.1 into the second stage. If the second stage 56.2 is also in a "1" state, the process will be repeated and a carry signal will be propagated to the third stage (not shown). However, if the first, second or any subsequent stage is in a "0" state when the carry signal is received, the stage will not generate a further carry signal, but will instead generate a borrow signal on its line 74. This signal will have no effect in an up-counting operation, since none of the AND gates 60 are enabled in an up-counting operation.

Down-counting operates on a similar principle. A borrow signal will be propagated to a subsequent stage only if the stage receiving it is currently in the "0" state. It will therefore be appreciated that the counter operates to perform bidirectional counting of unipolar pulses on lines 52 and 54 from the quantizer 24.

Operation of the counter stages 56 as bistable elements is discussed at length in the cited Hurrell paper. For purposes of understanding the present invention, each stage can best be understood from the pendulum analogy already introduced. As FIG. 3 shows, application of a field bias current to the inductor 70 results in separation of the phases as shown at 42. In the counter application of the dual-junction SQUID, the current applied to the inductance is a constant bias current, rather than the varying analog current in the quantizer application. The other basic difference between the two applications is that the gate current in the counter stage is applied intermittently. The bias current through the inductor biases the circuit to a point of bistability in its characteristic. If the gate current is maintained below a threshold level, the circuit is held stably in one state, but if the gate current is raised momentarily above the threshold, the phase states of the two junctions are reversed, as indicated at 46 in FIG. 3. So long as the gate current is reduced again rapidly, the new state of the stage is also a stable one.

Although the AND gates 58 and 60 and the OR gates 76 and 78 have been discussed as conventional logic elements, they also take the form of SQUID's in the preferred embodiment of the invention. FIG. 4 shows a basic current injection double-junction SQUID for use as one of the OR gates or AND gates in the converter of FIG. 2. It comprises a center-tapped inductance 90 and two junctions 92 and 94 connected in the usual manner, with a gate current applied to the center tap of the inductance, an input current applied to one end of the inductance and an output current obtained from the other end. An output pulse is obtained from the circuit when the injected current and gate current are supplied as appropriately conditioned input signals. For use as an AND gate, the two signals to be ANDed are resistively combined for input as the injected current. The signal levels of the inputs are adjusted by resistive networks such that neither signal is sufficient to switch the SQUID.

Figure 4A:
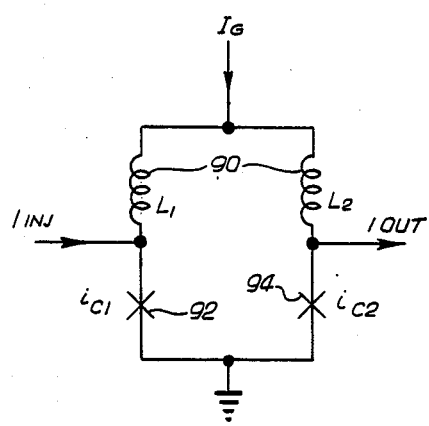
FIG. 4a is a schematic diagram showing the equivalent circuit of a double-junction SQUID employed as an AND gate and as an OR gate in the FIG. 2 schematic diagram.
Figure 4B:
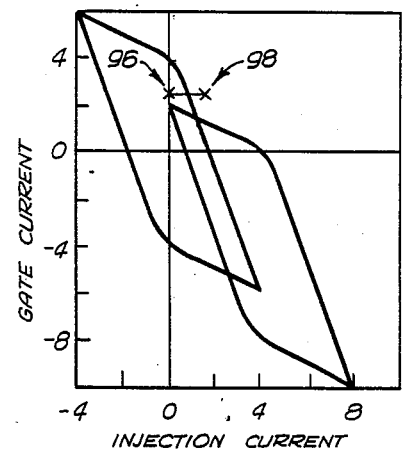

As shown in FIG. 4b, the static solution to the equations governing operation of a double-junction SQUID like the one shown in FIG. 4a may be represented as two overlapping lobes, each of which represents one state of the circuit. The region of overlap is an indeterminate one and not of interest to the OR gate or AND gate application. For use as a gate, the circuit is biased with a gate current to a position indicated at 96 in FIG. 4b. When a positive injection current of sufficient magnitude is applied to the circuit as as an input signal, the operating point is moved to a position 98 outside the upper lobe, and an output pulse is generated. For operation as an AND gate, two input signals are resistively combined, and must both be present to move the operating point sufficiently to generate an output pulse.

Figure 5:
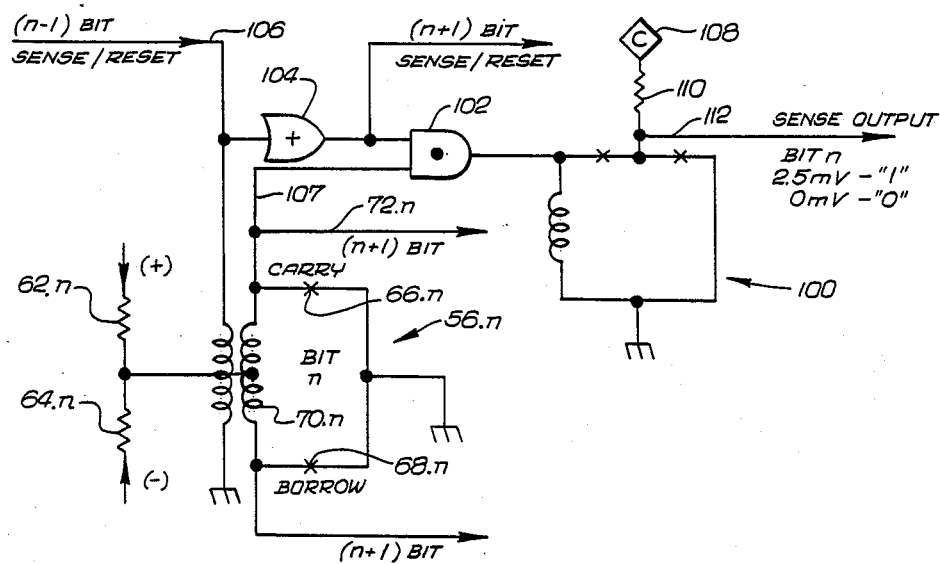
FIG. 5 is a simplified schematic diagram of a sense gate employed to read a digital count from the converter of FIG. 2.

Circuitry has also to be provided for sensing the states of the counter stages 56 each time that a sample of the analog signal is needed. The state of each stage can best be detected by applying an input signal to each stage, although this approach is necessarily destructive of the value stored in the counter. FIG. 5 shows such a scheme, in which the sensing operation resets the counter. Each stage 56 of the counter has an associated sense gate that includes a double-junction SQUID 100 an AND gate 102 and an OR gate 104. A sense/reset line 106 from the previous stage is used to transformer-couple a sense signal to the stage 56. The sense signal is also coupled through the OR gate 104 and thence to the next counter stage and to one input of the AND gate 102. Application of the sense signal to the stage 56 produces an output on the carry side of the stage if the stage was in a "1" state before sensing. This sensed carry output is transmitted over line 107 for input to the AND gate 102, which is enabled by the original sense signal, appropriately delayed by the OR gate 104.

The output of AND gate 102 provides an input to the SQUID 100. The gate current of this SQUID is supplied from a clock signal 108 connected to the common point between the junctions through a resistor 110. The input to the SQUID 100 is applied to one end of its inductor and the other end of the inductor is grounded. A sensed "1" condition is output on line 112 from the common point between the junctions, as a small positive voltage. A sensed "0" condition is output on line 112 as a zero voltage. The sensing signal has to be timed to avoid interference with the rippling carry or borrow signals in the counter.

It will be appreciated from the foregoing that the present invention represents a significant advance in the fields of A/D converters and high-speed bidirectional counters. In particular, the invention provides a superconductive quantizer capable of producing unipolar pulses on two output terminals indicative of current increases and decreases. A bidirectional counter capable of processing the unipolar pulses is a desirable adjunct to the quantizer and may also be useful in other counter applications.

It will also be appreciated that, although a specific embodiment of the invention has been described in detail for purposes of illustration, various modifications may be made without departing from the spirit and scope of the invention. Accordingly, the invention is not to be limited except as by the appended claims.

We claim:

1. A superconducting analog-to-digital converter, comprising:
   a double-junction superconducting quantum interference device (SQUID) having first and second Josephson junctions and a center-tapped load inductance;
   means for applying a constant gate current to the center of the load inductance;
   means for applying a varying analog signal current to the load inductance, wherein positive incremental changes in the analog signal current result in the generation of voltage pulses across the first junction, and negative incremental changes in the analog current signal result in the generation of voltage pulses of the same polarity across the second junction; and
   means for counting the voltage pulses generated across the first and second juctions, to determine the corresponding digital equivalents of the changes in the analog signal current.

2. A superconducting analog-to-digital converter as set forth in claim 1, wherein the means for counting includes:
   a plurality of counter stages, each including a SQUID configured as a bistable element and each having a single input terminal for receiving a signal that operates to toggle the state of the stage, a carry output terminal for outputting a carry signal when the stage is toggled from a "1" state to a "0" state, and a borrow output terminal for outputting a borrow signal when the stage is toggled from a "0" state to a "1" state;
   means for clocking up-count signals and down-count signals into the first stage of the counter;
   means responsive to an up-count signal, for enabling propagation of a carry signal from one stage to the next in sequence;
   means responsive to a down-count signal, for enabling propagation of a borrow signal from one stage to the next in sequence;
   whereby application of up-count and down-count signals to the counter results in ripple addition and ripple subtraction of a binary "1" at the least-significant bit position of the counter.

3. A superconducting analog-to-digital converter as set forth in claim 2, wherein:
   the means for enabling propagation of the carry and borrow signals include logic gates implemented in the form of SQUID's.

4. A superconducting analog-to-digital converter as set forth in claim 2, wherein:

the means for enabling propagation of the carry and borrow signals include logic gates implemented in the form of double-junction SQUID's.

5. A superconducting analog-to-digital converter as set forth in claim 2, wherein the means for counting further includes:
   means for sensing the count value stored in the counter.

6. A superconducting analog-to-digital converter, comprising:
   an inductance having a center-tap terminal and two end terminals;
   first and second Josephson junctions, each having first and second terminals, the first terminals being connected together and the second terminal being connected to opposite end terminals of the inductance;
   means for applying a constant gate current to the center-tap terminal of the inductance;
   means for applying a varying analog signal current to the inductance, wherein positive inremental changes in the analog signal current result in the generation of voltage pulses across the first junction, and negative incremental changes in the analog signal current result in the generation of voltage pulses of the same polarity across the second junction; and
   means for counting the voltage pulses generated across the first and second junctions, to determine the corresponding digital value of the changes in the analog signal current.

7. A superconducting analog-to-digital converter as set forth in claim 6, wherein the means for counting includes:
   a plurality of counter stages, each including a SQUID configured as a bistable element and each having a single input terminal for receiving a signal that operates to toggle the state of the stage, a carry output terminal for outputting a carry signal when the stage is toggled from a "1" state to a "0" state, and a borrow output terminal for outputting a borrow signal when the stage is toggled from a "0" state to a "1" state;
   means for up-count signals and down-count signals into the first stage of the counter;
   means responsive to an up-count signal, for enabling propagation of a carry signal from one stage to the next in sequence;
   means responsive to a down-count signal, for enabling propagation of a borrow signal from one stage to the next in sequence;
   whereby application of up-count and down-count signals to the counter results in ripple addition and ripple subtraction of a binary "1" at the least-significant bit position of the counter.

8. A superconducting analog-to digital converter as set forth in claim 7 wherein:
   the means for enabling propagation of the carry and borrow signals include logic gates implemented in the form of SQUID's.

9. A superconducting analog-to digital converter as set forth in claim 7, wherein the means for counting further includes:
   means for sensing the count value stored in the counter.

10. A superconducting bidirectional counter, comprising:
    a plurality of counter stages, each including a SQUID configured as a bistable element and each having a single input terminal for receiving a signal that operates to toggle the state of the stage, a carry output terminal for outputting a carry signal when the stage is toggled from a "1" state to a "0" state, and a borrow output terminal for outputting a borrow signal when the stage is toggled from a "0" state to a "1" state;
    means for enabling up-count signals and down-count signals to the first stage of the counter;
    means responsive to an up-count signal, for enabling propagation of a carry signal from one stage to the next in sequence;
    means responsive to a down-count signal, for enabling propagation of a borrow signal from one stage to the next in sequence;
    whereby application of up-count and down-count signals to the counter results in ripple addition and ripple subtraction of a binary "1" at the least-significant bit position of the counter.

11. A superconducting bidirectional counter as set forth in claim 10, wherein:
    the means for enabling propagation of the carry and borrow signals include logic gates implemented in the form of SQUID's.

12. A superconducting bidirectional counter as set forth in claim 10, wherein:
    the means for enabling propagation of the carry and borrow signals include logic gates implemented in the form of double-junction SQUID's.

13. A superconducting bidirectional counter as set forth in claim 10, wherein the means for counting further includes:
    means for sensing the count value stored in the counter.

* * * * *